(12) United States Patent
Lu et al.

(10) Patent No.: US 9,018,771 B2
(45) Date of Patent: Apr. 28, 2015

(54) THIN FILM APPARATUS

(71) Applicant: SenseTech Co., Ltd, Taipei (TW)

(72) Inventors: Po-Wei Lu, Bade (TW); Mao-Chen Liu, Nantou County (TW); Wen-Chieh Chou, Taoyuan County (TW); Chun-Chieh Wang, Taichung (TW); Shu-Yi Weng, Miaoli County (TW)

(73) Assignee: Sensor Tek Co., Ltd., Taipei (TW)

( * ) Notice: Subject to any disclaimer, the term of this patent is extended or adjusted under 35 U.S.C. 154(b) by 0 days.

(21) Appl. No.: 14/200,905

(22) Filed: Mar. 7, 2014

(65) Prior Publication Data
US 2014/0252362 A1    Sep. 11, 2014

(30) Foreign Application Priority Data
Mar. 8, 2013    (TW) ............... 102108322 A

(51) Int. Cl.
*H01L 27/10* (2006.01)
*H01L 29/04* (2006.01)

(52) U.S. Cl.
CPC ............... *H01L 27/10* (2013.01); *H01L 29/04* (2013.01)

(58) Field of Classification Search
CPC .. H01L 27/10; H01L 29/04; H01L 2924/1461
USPC ................. 257/5, 64, 776; 438/900
See application file for complete search history.

(56) References Cited

U.S. PATENT DOCUMENTS

| | | | |
|---|---|---|---|
| 7,227,432 B2* | 6/2007 | Lutz et al. ............... | 333/186 |
| 8,166,827 B2* | 5/2012 | Miyoshi et al. ............ | 73/727 |
| 8,653,634 B2* | 2/2014 | Chiu et al. ............... | 257/659 |
| 2003/0146464 A1* | 8/2003 | Prophet .................. | 257/306 |
| 2010/0059244 A1* | 3/2010 | Ishii ..................... | 174/50.5 |
| 2010/0059836 A1* | 3/2010 | Miyoshi et al. ........... | 257/419 |
| 2010/0107772 A1* | 5/2010 | Takizawa ................. | 73/723 |
| 2012/0170103 A1* | 7/2012 | Gupta et al. ............. | 359/291 |
| 2012/0267730 A1* | 10/2012 | Renard et al. ............. | 257/415 |
| 2013/0328176 A1* | 12/2013 | Chiu et al. ............... | 257/659 |

* cited by examiner

*Primary Examiner* — Allan R Wilson
(74) *Attorney, Agent, or Firm* — Muncy, Geissler, Olds & Lowe, P.C.

(57) ABSTRACT

A thin film apparatus having a plurality of thin film cells is disclosed. Each thin film cell includes a crystalline layer and a surrounding layer. The crystalline layer has a shape of polygon. The surrounding layer is partially located on the crystalline layer. The crystalline layer is surrounded by the surrounding layer.

5 Claims, 3 Drawing Sheets

THIN FILM APPARATUS

CROSS-REFERENCE TO RELATED APPLICATIONS

This non-provisional application claims priority under 35 U.S.C. §119(a) on Patent Application No(s). 102108322 filed in Taiwan, R.O.C. on Mar. 8, 2013, the entire contents of which are hereby incorporated by reference.

TECHNICAL FIELD

The disclosure relates to a thin film apparatus, and more particularly to a thin film apparatus which has a stronger structural strength and a stable and firm structure that is not deformed.

BACKGROUND

For the semiconductor fabrication of semiconductor devices, metal layers and oxide layers are very commonly used. Most metal layers are formed through a physical deposition whereby these metal layers usually have tensile stress. Most oxide layers are formed through a chemical deposition whereby these oxide layers usually have compressive stress. Take a MEMS apparatus as an example. The residual stress of the MEMS apparatus is an equivalent stress combining the compressive stress with the tensile stress. The MEMS apparatus can integrate an application-specific integrated circuit (ASIC) and a MEMS together in the same surface, thereby simplifying its packaging process.

However, the MEMS structure of the MEMS apparatus will be affected by its residual stress. Take a common XY-axis accelerometer as an example of the MEMS apparatus. The tensile stress of the metal layer will curve the MEMS structure upward, and the compressive stress of the oxide layer will curve the MEMS structure downward. Since the oxide layer is formed with the chemically produced bonding, the oxide layer has a high temperature of deposition and the bond force may cause that the residual stress of the oxide layer is larger than the residual stress of the metal layer. Therefore, the residual stress of the oxide layer leads the MEMS structure to be curved downward. Even if the residual stress can be released through the rapid thermal annealing (RTA) system, the thermal expansion coefficient of composite material will also affect the MEMS structure. For example, the thermal expansion coefficient of aluminum is 23 ppm/° C., and the thermal expansion coefficient of the oxide layer is 0.5 ppm/° C. In this case, the thermal expansion coefficient of aluminum is 46 times the thermal expansion coefficient of the oxide layer. Since the temperature around the MEMS apparatus may change, the design of the MEMS apparatus should consider not only its residual stress but also the thermal expansion related with two different layered materials.

Generally, since MEMS apparatuses nowadays are easily affected by residual stress and temperature and do not have firm structures, these MEMS apparatuses are easily deformed. Moreover, if the structural strength of the MEMS apparatus is not strong enough, the MEMS apparatus may easily be curved due to the change of external force.

SUMMARY

According to one or more embodiments, the disclosure provides a thin film apparatus. In one embodiment, the thin film apparatus may include a plurality of thin film units, and each of the thin film units may include a crystalline layer and a surrounding layer. The crystalline layer may be polygonal. The surrounding layer may be located on and partially surround the crystalline layer.

In this way, the thin film apparatus may employ the surrounding layers to respectively surround the crystalline layers which are regular hexagon, to form the thin film units, and further employ an articulation layer to connect with the thin film units, thereby enhancing the structural strength of the thin film apparatus. Therefore, the thin film apparatus may have a stable and firm structure that is not deformed, and have a better sensitivity. Moreover, the thin film apparatus may be applied to more MEMS fields.

BRIEF DESCRIPTION OF THE DRAWINGS

The present disclosure will become more fully understood from the detailed description given herein below for illustration only and thus does not limit the present disclosure, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
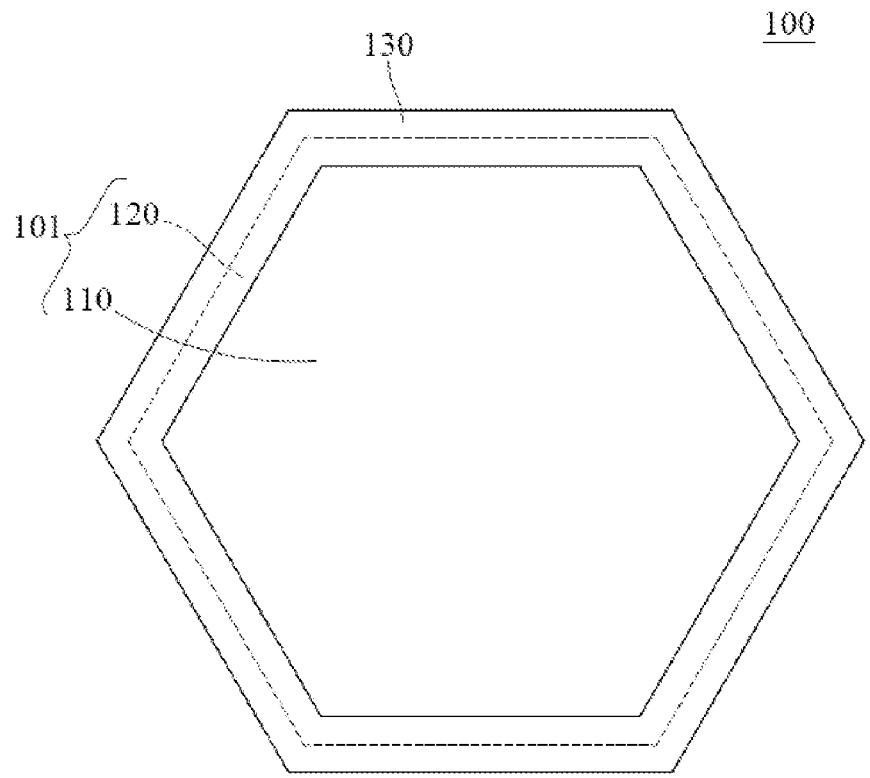
FIG. 1 is top view of a thin film unit of a thin film apparatus.
Figure 2:
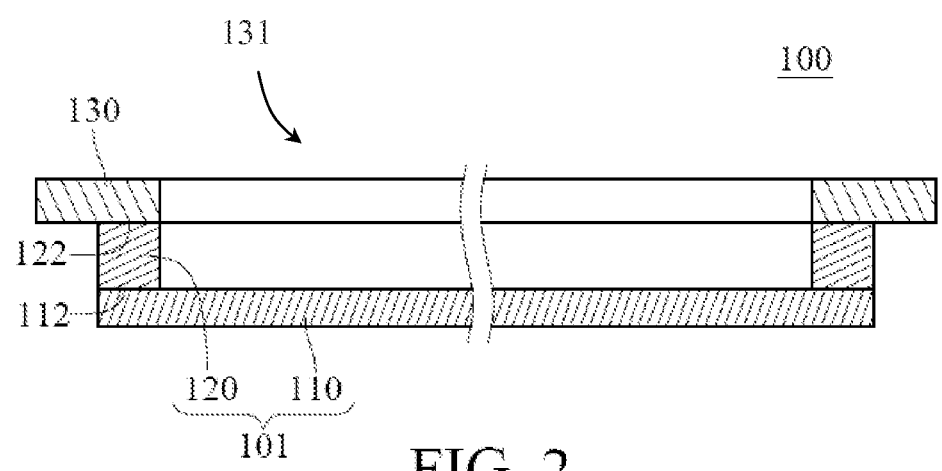
FIG. 2 is a lateral view of the thin film unit.
Figure 3:
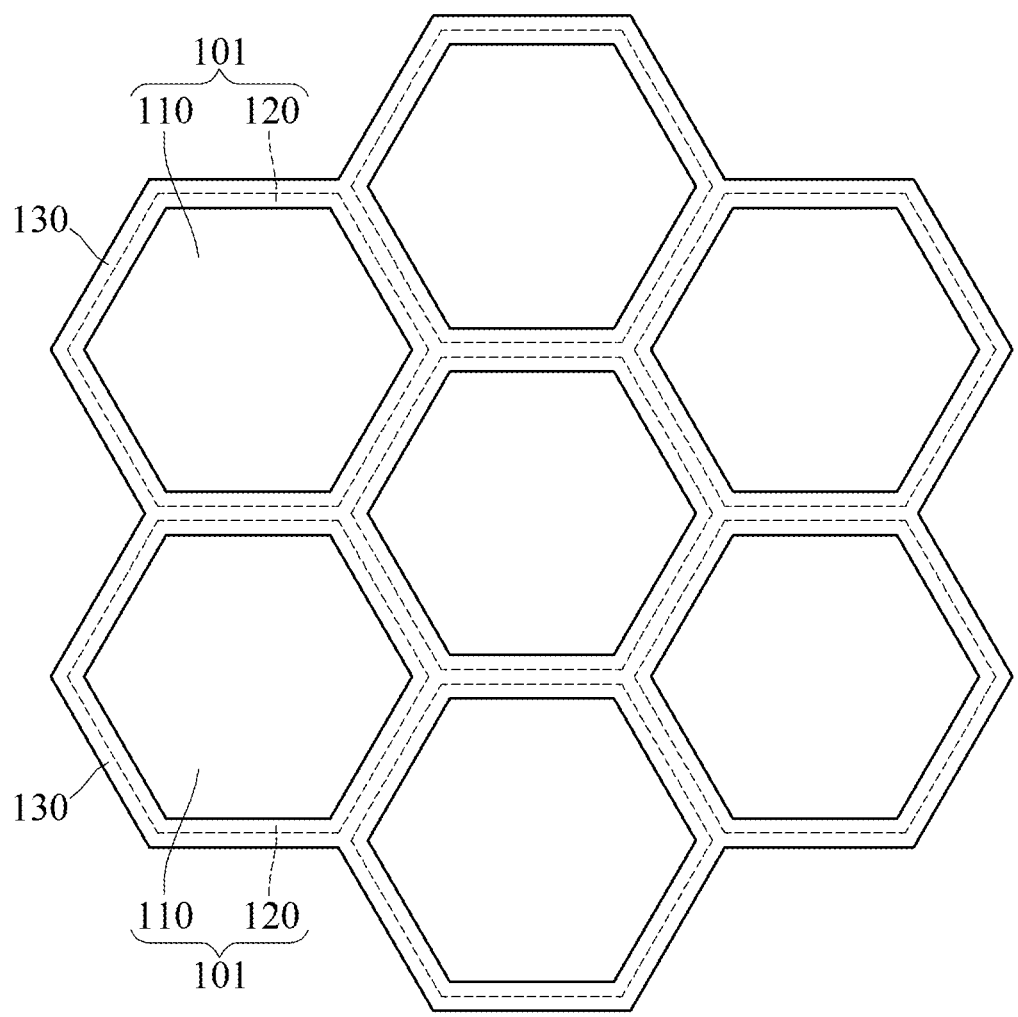
FIG. 3 is a schematic view of a part of the thin film apparatus.

Referring to FIG. 1, FIG. 2, and FIG. 3, a thin film apparatus 100 is shown according to one ore more embodiments in the disclosure. The thin film apparatus 100 may be adapted to micro-electromechanical components such as microphones, pressure sensors, altimeters, flowmeters, tactometers, or other possible sensors. In other words, the micro-electromechanical component may be capable of being embodied by the thin film apparatus 100. The thin film apparatus 100 may comprise a plurality of thin film units 101. Each thin film unit 101 may comprise a crystalline layer 110 and a surrounding layer 120.

The crystalline layer 110 has a first surface 112 and may be polygonal. In the thin film apparatus 100, there may be many crystalline layers 110, and these crystalline layers 110 may be adjacent to each other and be located on the same surface. In one embodiment, the crystalline layer 110 may be regular-hexagonal. The crystalline layer 110 may be capable of bearing horizontal components (force) or vertical components (force) in different directions, so that these horizontal components or these vertical components may be balanced. In other words, the crystalline layer 110 may be capable of absorbing horizontal or vertical deformation. In one embodiment, the crystalline layer 110 may be or contain polycrystalline silicon or other materials with a small thermal expansion coefficient, but the disclosure will not be limited thereto.

The surrounding layer 120 has a second surface 122, and may be located on the first surface 112 of the crystalline layer 110 partially and surround the crystalline layer 110. In one embodiment, the surrounding layer 120 may support or increase the structural strength of the crystalline layer 110. In other words, the surrounding layer 120 may also be capable of bearing the aforementioned horizontal components (force) or vertical components (force) in different directions, so that the crystalline layer 110 may be capable of absorbing or bearing horizontal or vertical deformation and be prevented from being deformed. In one embodiment, the surrounding layer 120 may contain or be made of tungsten or other possible materials with relative larger hardness, but the disclosure will not be limited thereto.

In one embodiment, the thin film apparatus 100 may further comprise an articulation layer 130 for connecting the thin film units 101 with each other. The articulation layer 130 may partially be located on each thin film unit 101. The articulation layer may be located on the second surface 122 of the surrounding layer 120 and have an opening 131 exposing a part of the crystalline layer 110 uncovered by a first surface of the surrounding layer 120 opposite to the second surface 122 of the surrounding layer 120. In one embodiment, this articulation layer 130 may be a seismic reduction structure such as springs, so that the articulation layer 130 may absorb external force or absorb horizontal or vertical deformation caused by vibrations. Therefore, the thin film units 101 may have a stable and firm structure that is not deformed. In one embodiment, the articulation layer 130 may be made of metal, and more particularly contain Aluminum (Al), tungsten (W), platinum (Pt) or other metallic element.

Figure 4:
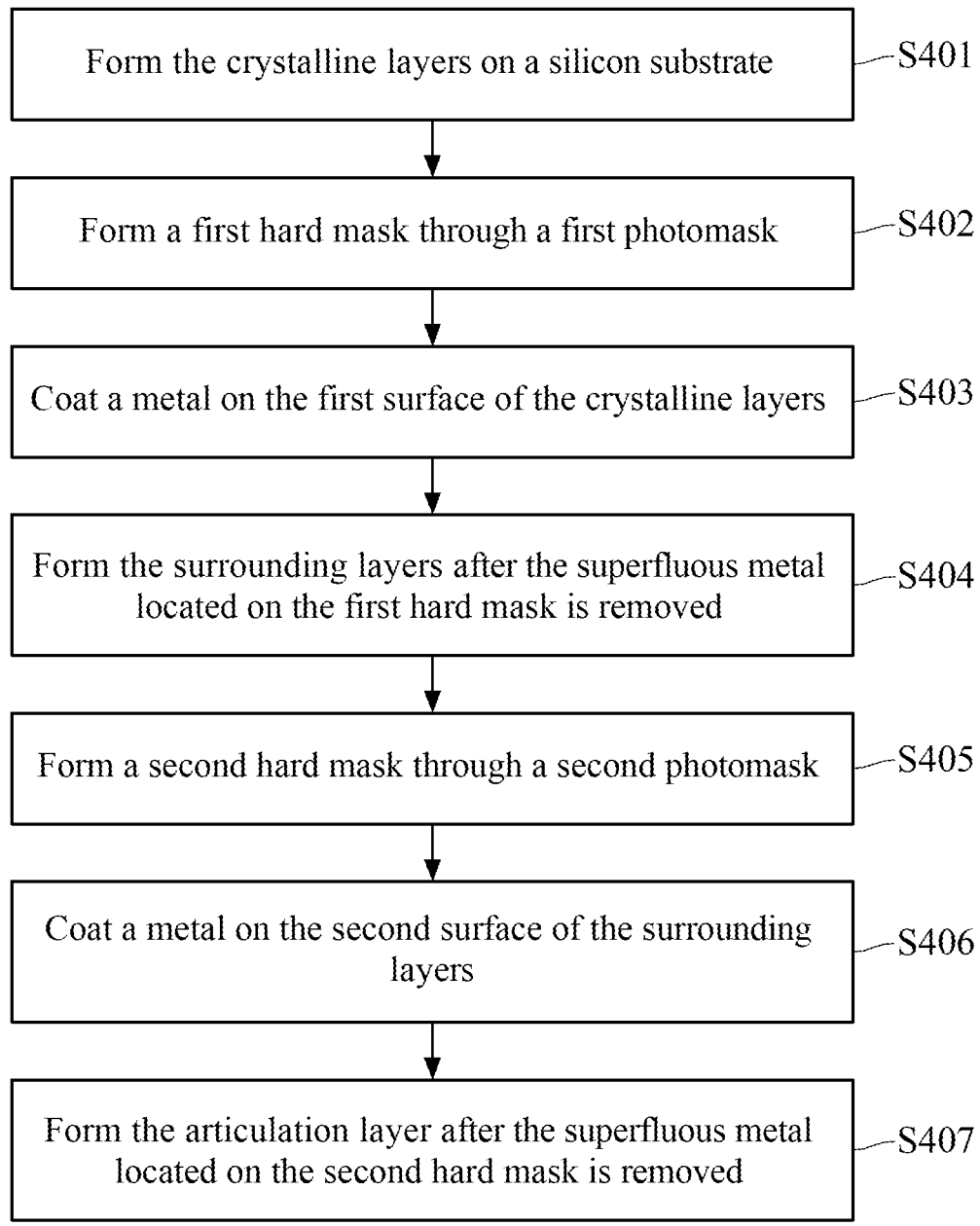
FIG. 4 is a flow chart of fabricating the thin film apparatus.

For the above thin film apparatus 100, the fabrication method of the thin film apparatus 100 is illustrated below by referring to FIG. 4. Firstly, as shown in step S401, the crystalline layers 110 may be formed on a silicon substrate. For example, the method of forming the crystalline layers 110 on the silicon substrate may be thin film deposition, and the crystalline layer 110 may be made of polycrystalline silicon. Then, a first hard mask may be formed through a first photomask, as shown in step S402. In one embodiment of forming the first hard mask, photoresist may be smeared on the crystalline layers 110, and then the photoresist on the crystalline layers 110 may be photolithographed to form the first hard mask. Herein, the region not covered by the first hard mask is where the surrounding layer 120 is formed, and the surrounding layer 120 may contain tungsten. Next, a metal, such as tungsten, may be coated on the first surface 112 of each crystalline layer 110 as shown in step S403, and after the superfluous metal located on the first hard mask is lifted off or removed, the rest metal may form the surrounding layers 120 as shown in S404. In one embodiment, the method of coating the metal may be performed via an electronic gun or a sputter.

Subsequently, a photoresist may be smeared again on each thin film unit 101 including the crystalline layer 110 and the surrounding layer 120, and the photoresist may be photolithographed through a second photomask to form a second hard mask, as shown in step S405. Herein, the region not covered by the second hard mask is where the metallic articulation layer 130 is formed. Finally, after a metal is coated on the second surface 122 of the surrounding layers 120 as shown in step S406, the superfluous metal on the second hard mask may be removed and the rest of the metal may form the articulation layer 130 as shown in step S407.

In summary, the thin film apparatus in the disclosure may employ the surrounding layers to respectively surround the crystalline layers which are regular hexagon, to form the thin film units, and further employ an articulation layer to connect with the thin film units, thereby enhancing the structural strength of the thin film apparatus. Therefore, the thin film apparatus may have a stable and firm structure that is not deformed, and have a better sensitivity. Moreover, the thin film apparatus may be applied to more MEMS fields.

What is claimed is:

1. A thin film apparatus, comprising a plurality of thin film units each of which comprises:
   a crystalline layer which is polygonal;
   a surrounding layer, surrounding and partially being located on the crystalline layer; and
   an articulation layer which is located on a second surface of the surrounding layer, has an opening exposing a part of the crystalline layer uncovered by a first surface of the surrounding layer opposite to the second surface of the surrounding layer, and is configured to connect the plurality of thin film units with each other.

2. The thin film apparatus according to claim 1, wherein the articulation layer is made of metal.

3. The thin film apparatus according to claim 1, wherein the crystalline layer contains polycrystalline silicon.

4. The thin film apparatus according to claim 1, wherein the crystalline layer is regular-hexagonal.

5. The thin film apparatus according to claim 1, wherein the surrounding layer contains tungsten.

* * * * *